United States Patent
Hejdeman et al.

(10) Patent No.: US 6,903,986 B2
(45) Date of Patent: Jun. 7, 2005

(54) METHOD AND APPARATUS FOR IMPROVING THE RELIABILITY OF THE READING OF INTEGRATED CIRCUIT FUSES

(75) Inventors: Carl R. M. Hejdeman, Basingstoke (GB); Andrew McKnight, Southampton (GB)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 10/472,258
(22) PCT Filed: Jul. 3, 2002
(86) PCT No.: PCT/US02/21267

§ 371 (c)(1),
(2), (4) Date: Aug. 10, 2004

(87) PCT Pub. No.: WO03/096353

PCT Pub. Date: Nov. 20, 2003

(65) Prior Publication Data

US 2004/0257892 A1 Dec. 23, 2004

Related U.S. Application Data

(60) Provisional application No. 60/379,377, filed on May 8, 2002.

(51) Int. Cl.⁷ .............................. G11C 7/00; G11C 29/00
(52) U.S. Cl. ..................... 365/201; 365/225.7; 327/53; 327/525; 257/529
(58) Field of Search .............................. 365/201, 225.7; 327/525, 53; 257/529

(56) References Cited

U.S. PATENT DOCUMENTS

| | | | |
|---|---|---|---|
| 4,773,046 A | | 9/1988 | Akaogi et al. |
| 6,125,069 A | * | 9/2000 | Aoki ........................ 365/225.7 |
| 6,268,760 B1 | | 7/2001 | Marshall et al. |
| 6,346,738 B1 | | 2/2002 | Kim et al. |
| 6,346,846 B1 | | 2/2002 | Bertin et al. |
| 6,384,664 B1 | * | 5/2002 | Hellums et al. ............ 327/525 |
| 6,417,720 B1 | | 7/2002 | Denham |

* cited by examiner

*Primary Examiner*—VanThu Nguyen
(74) *Attorney, Agent, or Firm*—Oppedahl & Larson

(57) ABSTRACT

A system is provided for use with an on-chip fuse. If the fuse (40) is to be blown, the system blows the fuse, then performs a test read by comparing it with a larger-than-normal reference resistance (41, 42). If, even using the larger-than-normal reference resistance, the fuse reads as blown, then it is possible to be much more confident that the fuse will read correctly when compared against the normal reference resistance (42), even with aging and with variations of temperature and supply. For future reads during normal operation, the system compares it with the normal reference resistance (42). If, on the other hand, the fuse does not read as blown during the test read then the device can be rejected as a failed device.

13 Claims, 1 Drawing Sheet

METHOD AND APPARATUS FOR IMPROVING THE RELIABILITY OF THE READING OF INTEGRATED CIRCUIT FUSES

This application claims priority from U.S. appl. No. 60/379,377 entitled "Method for improving the reliability of integrated circuit fuse reading" and filed May 8, 2002, which application is incorporated herein by reference.

BACKGROUND

The application relates generally to blowing and reading fuses formed within integrated circuits, and relates particularly to reading the fuses in a way that has improved reliability.

In many systems it is desirable to have a nonvolatile memory. In some applications a static RAM with a backup battery will be suitable, and in other applications an EEPROM may be suitable. But in recent times there has been great pressure on system designers to reduce the size and power consumption of a system. Such pressure is particularly great with cellular telephones, personal digital assistants (PDAs), and notebook computers. In such a system, any decision that adds to the bulk or weight is undesirable, for example a decision to increase the chip count (to accommodate an external memory) or a decision to add a backup battery for a memory.

The general goal of reducing chip count provides motivation to try to use nonvolatile memory devices which can be fabricated within some existing chip in the system. One technology for such memory is the use of fuses. One or more fuses are fabricated within the chip. Circuitry is provided which will pass some specified current through the fuse, which "blows" the fuse. Other circuitry measures the resistance of the fuse. If the resistance is low, then it is presumed that the fuse has not been blown. If the resistance is high, then it is understood that the fuse has been blown. Each fuse represents one binary data bit, and its blown or non-blown state is defined as a logic level of the binary data bit.

Several technologies for on-chip fuses have been proposed and used. One commonly used technology is a polysilicon fuse. A high current is passed through the fuse which "blows" the fuse. As will be appreciated, it is necessary to distinguish later between the "blown" and "non-blown" conditions of the fuse.

It is desirable that the fuse, in its unblown state, have a low impedance, because this makes it easier to get sufficiently high current through the fuse to blow it. It is also desirable that the fuse be constructed in a way that minimizing explosive decomposition which could result in damage to adjacent or nearby circuit structires.

Where a CMOS process is being used to fabricate the chip, to reduce the resistance of the polysilicon fuse in its non-blown state, the fuse is manufactured with Ti-silicide doping. The Ti-silicide doping has the advantage not only of reducing the unblown impedance, but also of minimizing or eliminating explosive decomposition of the fuse.

While Ti-silicide doping has the advantage of reducing the unblown resistance and resisting explosive decomposition, it has a potential drawback in that it "blowing" such a fuse results only in a process of silicide agglomeration once the fuse heats up to around 800° C. This results in the fuse undergoing a phase change of state which results in the fuse impedance changing from its unblown state of around 100 ohms to its blown state of any value from around 1 KΩ to 500 KΩ. This means that it is not easy to know exactly what resistance in the fuse represents a "blown" state.

A typical way of reading the fuse (determining whether it is blown or unblown, that is, whether it represents a binary "1" or binary "0" value) is to compare the value of the fuse impedance with a fixed reference resistance. If the fuse impedance is greater than the reference then it is read as blown, otherwise it is read as unblown. The comparison can be achieved by a number of techniques, but the most obvious is to force identical currents through the fuse and the reference resistor and to compare the resultant voltages using some form of voltage comparator.

Experience shows that such a blown fuse may change its resistance slightly with temperature or aging. This means that if a blown fuse impedance is very close to the reference resistance then it may read as blown one time then as unblown another time. Such a result is extremely undesirable.

It will be appreciated that while this problem is described in particular connection with polysilicon fuses, it presents itself with any fuse technology in which a blown fuse does not blow to a very high impedance.

It would be advantageous if an approach could be developed which permits determining, before a chip is placed into service, whether the chip is likely to provide a reliable reading of its fuses. If such an approach were available, it could be used to test a chip; if the chip turned out to be unlikely to provide reliable reading of its fuses, a decision could be made not to place the chip into service.

SUMMARY OF THE INVENTION

A system is provided for use with an on-chip fuse. If the fuse is to be blown, the system blows the fuse, then performs a test read by comparing it with a larger-than-normal reference resistance. If, even using the larger-than-normal reference resistance, the fuse reads as blown, then it is possible to be much more confident that the fuse will read correctly when compared against the normal reference resistance, even with aging and with variations of temperature and supply voltage. For future reads during normal operation, the system compares it with the normal reference resistance. If, on the other hand, the fuse does not read as blown during the test read then the device can be rejected as a failed device.

DETAILED DESCRIPTION

Figure 1:
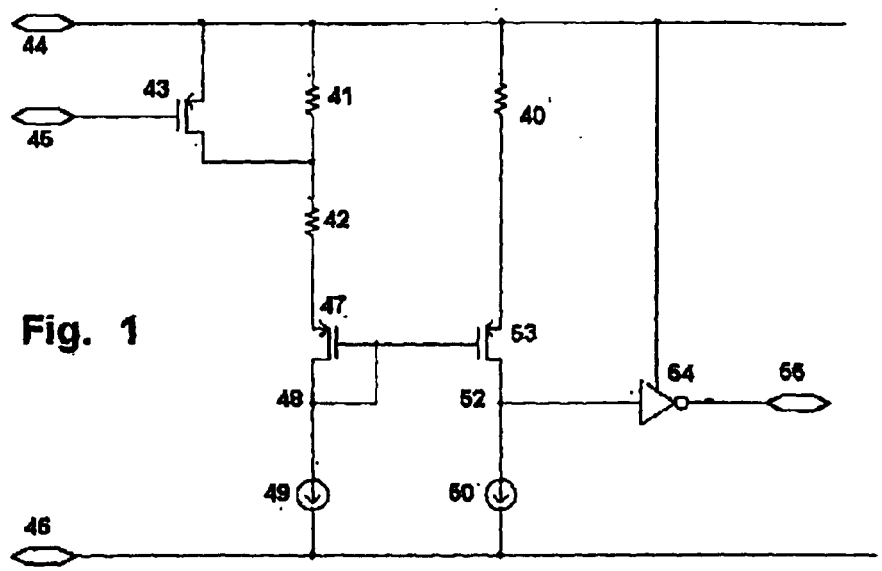
FIG. 1 is a schematic diagram of an embodiment of the invention.

FIG. 1 is a schematic diagram of an embodiment of the invention, with some detail omitted for clarity.

Fuse 40 is, in an exemplary embodiment, a polysilicon fuse. To read the fuse 40, the system compares the resistance of the fuse 40 with a reference resistance. The reference resistance is set by resistors 42 and 41, which may be 1 KΩ and 500 Ω respectively. During the test read, PMOS transistor switch 43 is turned off and the reference resistance becomes 1 KΩ plus 500 Ω giving a total resistance of 1.5 KΩ. During normal reads, transistor 43 is turned on which shorts out resistor 41, and therefore the reference resistance is only 1 K ohms plus a small switch resistance. The embodiment assumes a positive voltage $V_{DD}$ 44 and a ground 46.

PMOS transistor 43 is controlled by a "test read" signal 45.

Reading is achieved by enabling the current sinks 49 and 50. These sink identical currents ($I_{REF}$) through the fuse 40 and the reference resistance via gain transistors 53 and 47 respectively.

If the impedance of the fuse 40 is lower than the reference resistance (that is, if we are assuming it to be an unblown fuse) then transistor 53 is turned on more than transistor 47 which causes node 52 to rise which results in the data output 55 reading a logic 0.

If the impedance of the fuse 40 is higher than the reference resistance (that is, if are assuming it to be a blown fuse) then transistor 53 is turned on less than transistor 47 which causes node 52 to fall which results in the data output 55 reading a logic 1.

Omitted for clarity in FIG. 1 is an additional gain stage between node 52 and gate 54 to enhance sensitivity of the system.

Another configuration for implementing the comparison is to have the fuse 40 and reference resistor 41, 42 connected to ground 46. The gain transistors are NMOS instead of PMOS in this configuration, and the current references are connected to the supply voltage 44.

Yet another configuration is to force the reference currents directly across the fuse 40 and reference resistor 41, 42 rather than through gain transistors 47, 53. In this configuration, the resultant voltages at nodes 48, 52 are fed into a standard voltage comparator.

In a typical application of the invention, the test read is used before the chip is placed into service. That is, the test read will only be done during production testing and so this function can be transparent to the end user, that is, unnoticed by the end user.

The net benefit to the user is that the observed reliability of fuse reading is greatly enhanced.

It should be appreciated that the invention offers its benefits in situations where there is more than one fuse. Indeed in many chips it is expected that there will be several such fuses. Thus a typical sequence of steps may be performed, for example, with respect to a first fuse and a second fuse within an integrated circuit. Current is passed through the first fuse, thereby blowing the first fuse. Current is passed through the second fuse, thereby blowing the second fuse. The resistance of the first fuse is compared with a higher resistance than the reference resistance. The resistance of the second fuse is compared with the higher resistance. In the event that the resistance of the first fuse turns out to be higher than the higher resistance and the resistance of the second fuse turns out to be higher than the higher resistance, the integrated circuit is placed into service.

Later, after the integrated circuit is placed into service, from time to time the resistance of the first fuse is compared with the reference resistance, and the resistance of the second fuse is compared with the reference resistance.

It should be appreciated that another possible outcome of the test read is that the resistance of the first fuse will turn out to be lower than the higher resistance, or the resistance of the second fuse will turn out to be lower than the higher resistance. In that event, a decision is made that the integrated circuit will not be placed into service.

An exemplary apparatus will now be described with reference to FIG. 1. The apparatus comprises a fuse 40 having a resistance, a first reference resistance 42, and a second reference resistance 41, 42 greater than the first reference resistance 42.

In a first embodiment, a first constant-current reference 49 is connected in series with first and second resistors 42, 41 with a first MOSFET transistor 47 with source and drain between the first constant-current reference 49 and the first and second resistors 42, 41, a connection between the first constant-current reference 49 and the first MOSFET transistor 47 defining a first node 48. In addition, a second constant-current reference 50 is connected in series with the fuse 40 with a second MOSFET transistor 53 with source and drain between the second constant-current reference 50 and the fuse 40, a connection between the second constant-current reference 50 and the second MOSFET transistor 53 defining a second node 52. A switch 43 is in parallel with the second resistor 41. The gates of the first and second MOSFET transistors 47, 53 are connected together and to the first node 48. In this embodiment the first resistor 42 defines the first reference resistance, and the series-wise combination of the first and second resistors 42, 41 defines the second (higher) reference resistance. The second node 52 defines an output of the apparatus, and may be provided to an inverter 54 having a logic output 55. Positive supply voltage 44 and negative supply voltage 46 are provided. As may be seen in FIG. 1, the series-wise combination of the first and second resistors 42, 41 is connected to the positive supply voltage 44. The fuse 40 is also connected to the positive supply voltage 44. The first constant-current reference 49 is a current sink and is also connected to the negative supply voltage 46. The second constant-current reference 50 is a current sink and is also connected to the negative supply voltage 46. In this embodiment, the MOSFET transistors 47, 53 are PMOS.

In a second embodiment, the series-wise combination of the first and second resistors is connected to the negative supply voltage, and the is fuse also connected to the negative supply voltage. The first constant-current reference is a current source also connected to the positive supply voltage. The second constant-current reference is a current source also connected to the positive supply voltage. The MOSFET transistors are NMOS.

In a third embodiment, a first constant-current reference is connected in series with the first and second resistors, and a connection between the first constant-current reference and the first and second resistors defines a first node. A second constant-current reference is connected in series with the fuse, and a connection between the second constant-current reference and the fuse defines a second node. The first resistor defines the first reference resistance, and the series-wise combination of the first and second resistors defining the second reference resistance. A comparator receiving as inputs signals from the first and second nodes, and its output defines an output of the apparatus.

It should be appreciated that those skilled in the art will have little difficulty devising obvious variations of the invention, all of which are to be encompassed by the claims that follow.

What is claimed is:

1. A method for blowing and testing a first fuse and a second fuse within an integrated circuit, the resistance of the first fuse to be compared with a reference resistance when the integrated circuit is in service, the resistance of the second fuse to be compared with the reference resistance when the integrated circuit is in service, the method comprising the steps of:

passing current through the first fuse, thereby blowing the first fuse;

passing current through the second fuse, thereby blowing the second fuse;

comparing the resistance of the first fuse with a higher resistance than the reference resistance;

comparing the resistance of the second fuse with the higher resistance;

in the event of the resistance of the first fuse being higher than the higher resistance and the resistance of the second fuse being higher than the higher resistance, placing the integrated circuit into service.

2. The method of claim 1 further comprising the step of: comparing the resistance of the first fuse with the reference resistance.

3. The method of claim 2 further comprising the step of: comparing the resistance of the second fuse with the reference resistance.

4. A method for blowing and testing a first fuse and a second fuse within an integrated circuit, the resistance of the first fuse to be compared with a reference resistance when the integrated circuit is in service, the resistance of the second fuse to be compared with the reference resistance when the integrated circuit is in service, the method comprising the steps of:

passing current through the first fuse, thereby blowing the first fuse;

passing current through the second fuse, thereby blowing the second fuse;

comparing the resistance of the first fuse with a higher resistance than the reference resistance;

comparing the resistance of the second fuse with the higher resistance;

in the event of the resistance of the first fuse being lower than the higher resistance or the resistance of the second fuse being lower than the higher resistance, not placing the integrated circuit into service.

5. A method for blowing and testing a fuse within an integrated circuit, the resistance of the fuse to be compared with a reference resistance when the integrated circuit is in service, the method comprising the steps of:

passing current through the fuse, thereby blowing the fuse;

comparing the resistance of the fuse with a higher resistance than the reference resistance;

in the event of the resistance of the fuse being higher than the higher resistance, placing the integrated circuit into service.

6. The method of claim 5 further comprising the step of: comparing the resistance of the fuse with the reference resistance.

7. A method for blowing and testing a fuse within an integrated circuit, the resistance of the fuse to be compared with a reference resistance when the integrated circuit is in service, the method comprising the steps of:

passing current through the fuse, thereby blowing the fuse;

comparing the resistance of the fuse with a higher resistance than the reference resistance;

in the event of the resistance of the fuse being lower than the higher resistance, not placing the integrated circuit into service.

8. Apparatus formed on an integrated circuit comprising:
a fuse having a resistance;
a first reference resistance;
a second reference resistance greater than the first reference resistance;
first means responsive to a comparison of the first reference resistance with the fuse for providing an output indicative of whether the resistance of the fuse is greater than the first reference resistance; and
second means responsive to a comparison of the second reference resistance with the fuse for providing an output indicative of whether the resistance of the fuse is greater than the first reference resistance.

9. The apparatus of claim 8 wherein the first and second means comprise:

a first constant-current reference connected in series with first and second resistors with a first MOSFET transistor with source and drain between the first constant-current reference and the first and second resistors, a connection between the first constant-current reference and the first MOSFET transistor defining a first node;

a second constant-current reference connected in series with the fuse with a second MOSFET transistor with source and drain between the second constant-current reference and the fuse, a connection between the second constant-current reference and the second MOSFET transistor defining a second node;

a switch in parallel with the second resistor;

gates of the first and second MOSFET transistors connected together and to the first node;

the first resistor defining the first reference resistance, and the series-wise combination of the first and second resistors defining the second reference resistance;

the second node defining an output of the apparatus.

10. The apparatus of claim 9 further comprising positive and negative supply voltages, the series-wise combination of the first and second resistors also connected to the positive supply voltage;

the fuse also connected to the positive supply voltage;

the first constant-current reference comprising a current sink also connected to the negative supply voltage;

the second constant-current reference comprising a current sink also connected to the negative supply voltage;

the MOSFET transistors characterized as PMOS.

11. The apparatus of claim 9 further comprising positive and negative supply voltages, the series-wise combination of the first and second resistors also connected to the negative supply voltage;

the fuse also connected to the negative supply voltage;

the first constant-current reference comprising a current source also connected to the positive supply voltage;

the second constant-current reference comprising a current source also connected to the positive supply voltage;

the MOSFET transistors characterized as NMOS.

12. The apparatus of claim 8 wherein the first and second means comprise:

a first constant-current reference connected in series with first and second resistors, a connection between the first constant-current reference and the first and second resistors defining a first node;

a second constant-current reference connected in series with the fuse, a connection between the second constant-current reference and the fuse defining a second node;

a switch in parallel with the second resistor;

the first resistor defining the first reference resistance, and the series-wise combination of the first and second resistors defining the second reference resistance;

a comparator receiving as inputs signals from the first and second nodes, an output of the comparator defining an output of the apparatus.

13. The apparatus of claim 8 wherein the fuse is a polysilicon fuse.

* * * * *